United States Patent [19]

Sakiadis

[11] Patent Number: 4,875,279
[45] Date of Patent: Oct. 24, 1989

[54] DIE ATTACH PICKUP TOOLS

[75] Inventor: Byron C. Sakiadis, Chadds Ford, Pa.

[73] Assignee: E. I. Du Pont de Nemours and Company, Wilmington, Del.

[21] Appl. No.: 158,729

[22] Filed: Feb. 22, 1988

Related U.S. Application Data

[63] Continuation-in-part of Ser. No. 88,141, Aug. 21, 1987, abandoned, which is a continuation-in-part of Ser. No. 31,793, Mar. 30, 1987, abandoned.

[51] Int. Cl.[4] .............................................. H05K 13/04
[52] U.S. Cl. ........................................ 29/740; 29/743; 294/2; 294/64.1; 156/497; 156/572
[58] Field of Search ......................... 29/740, 743, 759; 294/64.1, 2; 156/497, 572, 538, DIG. 31

[56] References Cited

U.S. PATENT DOCUMENTS

| | | | |
|---|---|---|---|
| 1,033,069 | 7/1912 | Hansen | 294/64.1 |
| 3,762,015 | 10/1973 | Radobenko | 29/203 |
| 3,973,682 | 8/1976 | Neff | 214/1 |
| 4,185,814 | 1/1980 | Buchmann et al. | 271/108 |
| 4,290,732 | 9/1981 | Taki et al. | 47/91 |
| 4,381,601 | 5/1983 | Tamai et al. | 29/740 |
| 4,381,602 | 5/1983 | McIver | 29/840 |
| 4,393,579 | 7/1983 | Van Hooreweder | 29/740 |
| 4,461,610 | 7/1984 | Harigane et al. | 414/752 |
| 4,476,626 | 10/1984 | Gumbert et al. | 29/740 |
| 4,589,586 | 5/1986 | Polansky | 228/179 |
| 4,600,228 | 7/1986 | Tarbuck | 294/64.1 |
| 4,610,388 | 9/1986 | Koltuniak et al. | 228/6.2 |
| 4,620,738 | 11/1986 | Schwartz et al. | 294/64.1 |
| 4,646,432 | 3/1987 | Vancelette | 29/743 |
| 4,650,233 | 3/1987 | Mang et al. | 294/64.1 |
| 4,657,470 | 4/1987 | Clarke et al. | 414/627 |
| 4,667,870 | 5/1987 | Avedissian et al. | 228/103 |
| 4,670,981 | 6/1987 | Kubota et al. | 29/840 |
| 4,675,993 | 6/1987 | Harada | 29/740 |
| 4,712,784 | 12/1987 | Carrell | 294/64.1 X |

FOREIGN PATENT DOCUMENTS

2629160 1/1978 Fed. Rep. of Germany.

Primary Examiner—Carl E. Hall
Attorney, Agent, or Firm—John E. Griffiths

[57] ABSTRACT

Die attach pickup tools for relocating a flexible die attach. The pickup tools comprise a head portion connected to an end portion. The head portions have a face for contacting a die attach and at least one hole in the face. Passage means extend from the hole(s) through the tool for connection to a vacuum source.

10 Claims, 5 Drawing Sheets

PRIOR ART

DIE ATTACH PICKUP TOOLS

CROSS-REFERENCES TO RELATED APPLICATIONS

This application is a continuation-in-part of copending U.S. patent application Ser. No. 088,141, filed Aug. 21, 1987, now abandoned, which is a continuation-in-part of U.S. patent application Ser. No. 031,793, filed Mar. 30, 1987 now abandoned.

BACKGROUND OF THE INVENTION

1. Field of the Invention

The invention relates to die attach pickup tools for picking up a flexible die attach from a cutting station, transferring the die attach to a bond site and depositing the die attach on the bond site, more specifically for use in relocating flexible adhesive pads for bonding integrated circuit chips to substrates.

2. Description of the Prior Art

In the mass production of integrated circuit (IC) chip assemblies, a particularly critical step to the process is the step of bonding the IC chip to its substrate. Such substrates include lead frames, MLC chips, diodes, quartz crystals and the like.

Heretofore, IC chips have been bonded to the substrate with relatively inflexible adhesive pads of eutectic alloy or soft solder die attach ribbons. Mechanical devices or die bonders, as they are known in the art, have employed tools to pick up the relatively inflexible pads from a cutting station, to transfer them to a heated bonding site on a substrate, and to deposit them on the bond site of the substrate with slight pressure to effect bonding of the pads to the substrate. The heat of the site melts the pads, typically causing the pads to deform and flow as a liquid with concomitant reduction of their surface area.

Figure 1:
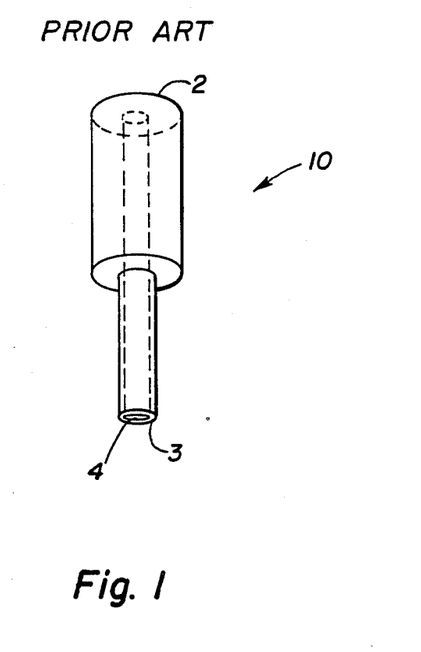
FIG. 1 illustrates a prior art die attach pickup tool for relocating pads of relatively inflexible ribbons.

Tools used in the art for this procedure consist of a hollow tubular element 10, such as illustrated in FIG. 1. One end 2 of the element connects to a vacuum source. Another end 3 of the tool contacts the inflexible adhesive pad or die attach. In operation, the vacuum source is turned on when the tool is programmed to pick up the die attach, transfer it, and deposit it on the bond site. The vacuum is turned off when the tool is programmed to release the die attach and return to the cutting station.

Subsequently, another mechanism sets an IC chip on the adhesive pad.

There are clear benefits in using a relative flexible thermoplastic polymer as the adhesive pad. A bonding process using such flexible thermoplastic pads is disclosed in copending U.S. patent application Ser. No. 088,141.

However, conventional pickup tools cannot be used to relocate flexible adhesive pads. Typically, the hole 4 in the end 3 of the tool is too large causing the flexible pad to be partially sucked into the tool hole 4 when the vacuum source is on. Faces of the tools which contact inflexible adhesive pads are smaller than the relative size of the pads being relocated. This causes a similarly sized flexible die attach to sag away from the prior art tool when picked up. These problems have further repercussions when the tool approaches a heated bonding site which softens the flexible pad. This softening further allows the pad to be sucked into the tool and curls the pad. When these deformations occur, the pad does not deposit flat, but in a partially folded form. The pad also tends to form gas pockets due to the non-flat placement. Further, the pressure required to transfer the pad from the conventional tool to the bond site typically leaves an impression on or cuts the flexible pad. At least in part due to these problems, conventional tools do not result in flexible pads being relocated in a uniform and reproducible manner.

From the foregoing description of the current state of the art, it is evident that there is a very substantial unmet need for pickup tools capable of relocating flexible die attach pads such that the pads are maintained in a substantially flat shape throughout the process.

SUMMARY OF THE INVENTION

The general purpose of this invention is to provide new and improved die attach pickup tools which are capable of relocating a pad of flexible ribbon while maintaining the pad substantially flat.

In order to accomplish this purpose, the present invention is directed to die attach pickup tools for picking up a flexible die attach having a first surface area and depositing the die attach in a substantially flat position comprising:

a face for contacting the first surface area of the die attach, the face having a second area at least as great as the first area and having at least a hole; and passage means connected to each said hole for connecting to a vacuum source.

The present invention is further directed to a die attach pickup tool for picking up a flexible die attach having a first surface area from a cutting station, transferring the die attach to a bond site and depositing the die attach on the bond site, the tool comprising:

a face for contacting the die attach, the face having a second surface area of at least about 1.27 mm square and a hole; and passage means connected to the hole for connecting to a vacuum source, such that when each point of the first surface area is in contact with a point of the second surface area or adjacent the hole then, upon turning on the vacuum source, the tool is adapted to pick up transfer the die attach and, upon turning off the vacuum source, the tool is adapted to deposit the die attach, all in a substantially flat position.

Phrased another way, the present invention is directed to an apparatus for relocating a pad of flexible ribbon comprising:

an end portion for connecting to a vacuum source;

a head portion connected to the end portion, the head portion having means for relocating a pad of flexible ribbon while maintaining the pad substantially flat; and an air passage for providing a vacuum through the end portion and the head portion including the relocating means.

BRIEF DESCRIPTION OF THE DRAWINGS

The invention can be more fully understood from the following detailed description taken in connection with accompanying drawings which form a part of this application and in which.

DETAILED DESCRIPTION OF THE PREFERRED EMBODIMENTS

Throughout the following detailed description, similar reference numerals refer to similar elements in all Figures of the drawings.

Figure 2:
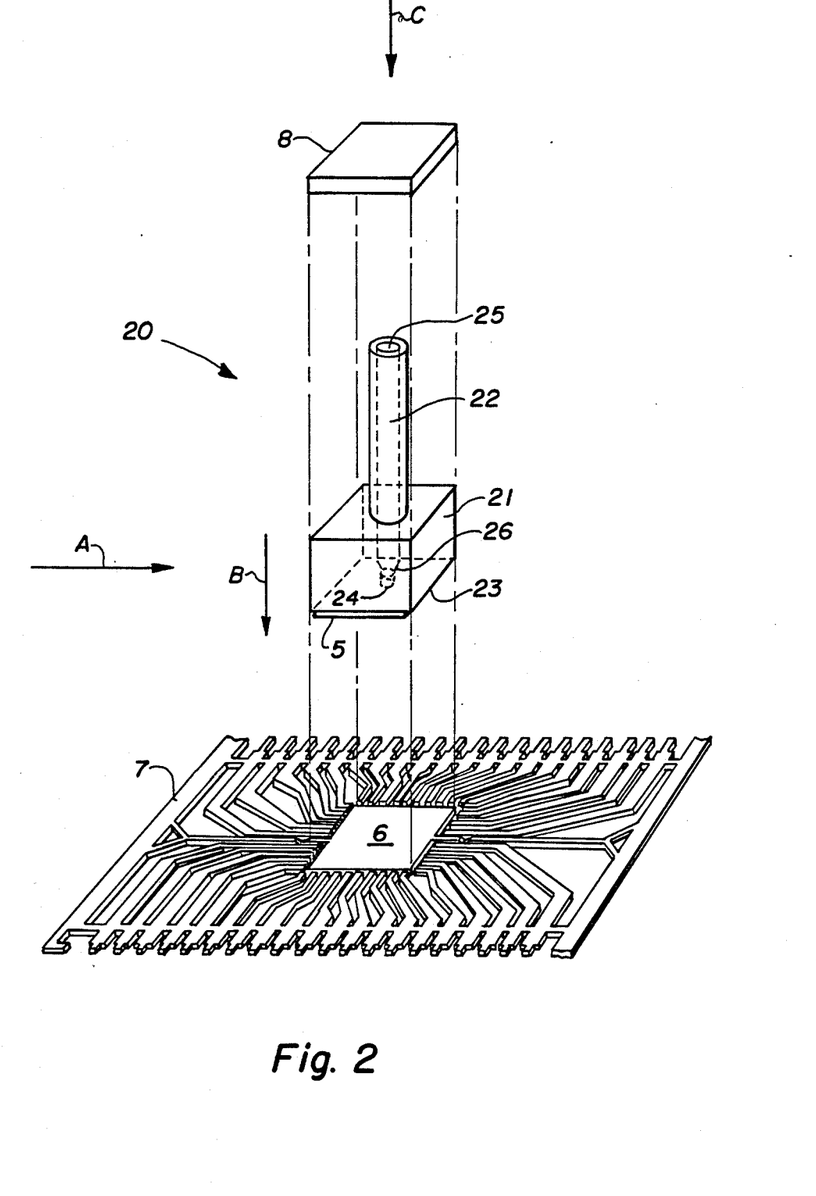
FIG. 2 shows a schematic perspective view of a die attach pickup tool of the present invention relocating a pad of flexible ribbon adhesive onto a bond site and an integrated circuit chip in the process of being applied to the site.

FIG. 2 is a schematic representation of a die attach pickup tool 20 of the present invention being used to relocate a pad 5 of a flexible die attach onto a bond site 6 of a substrate 7.

The pickup tool 20 comprises a head portion 21 connected to an end portion 22. The head portion 21 has a face 23 for contacting the die attach 5. The face 23 of the tool 20 is designed to be larger than, and preferably equal to or slightly larger than, the pad 5 of die attach to be used in the particular situation. The face 23 is preferably designed to conform to the shape of the pad 5 to be used. Pads and, therefore, faces can be square, rectangular or any other shape. The face 23 is flat, substantially flat, or slightly convex. A passage 25 extends through the end portion 22 and the head portion 21. The passage 25 directly connects to at least one hole 24 in the face 23 or, as illustrated in FIG. 2, through an intermediate passage section 26.

The face 23 has a surface area of at least about 1.27 mm square. The face 23 has at least one hole 24 in it connected to the intermediate passage section 26 or directly to the passage 25. Further, the face 23 has a hole 24 for each about 2.54 mm square. Each hole 24 preferably has a circular cross-sectional area and a diameter in the range of about 0.254 to 0.900 mm. The disposition of the holes on the face 23 is such that each hole is for holding an approximately or roughly equal weight of the pad 5. Typically, this requires the hole(s) 24 to be spaced from one another and from edges of the face 23. Using a face having at least two holes reduced possible rotation of the die attach on the face in the use of the tool.

The cross-sectional area or diameter of the passage 25 is larger than that of the hole(s) 24 to avoid over restricting the air flow which would slow down the on-off response of the tool 20. Typically, the average cross-sectional area or diameter of the intermediate passage section 26 is also larger than that of the hole(s) 24, but smaller than that of the passage 25.

The end portion 22 is for connecting to a vacuum source such that when the vacuum source is turned on a vacuum is created in the passage 25, passage section 26 and hole(s) 24 sucking air through the tool 20. The suction is capable of picking up and holding light objects, such as a die attach 5, adjacent the tool face 23. The end portion 22 can be separable from and insertable into a holder of an existing die bonder machine. Alternatively, the end portion 22 can be made part of the holder of a die bonder machine.

When a vacuum is created through the tool 20 in the range of about 9,000 Pa through 90,000 Pa, pickup tools as just described can relocate flexible pads 5 of adhesive having thicknesses in the range of about 25 through 125 micrometers with elastic modulus in the range of about 500 N/mm$^2$ through 7,500 N/mm$^2$ (Newtons per square millimeter) at 23° C., while maintaining them in a substantially flat position. This is accomplished when each point of a surface of the die attach 5 contacts a point of the face 23 or is adjacent the hole(s) 24 during the process.

Illustrative adhesive materials which can be relocated while maintained substantially flat are non-olefinic, predominantly amorphous, substantially solvent-free thermoplastic polymers having the following properties:

Tg is at least 30° C. and preferably at least 50° C.
Tb is below −30° C.,
Sw is less than 1.0% wt., and
Extractable ionics are less than 10 ppm by weight.

A wide variety of non-olefinic polymeric materials are available which may possess properties which meet the above-referred criteria such as polyarylates, polyetheretherketones, polyetherketoneketones, polyetherimides, nylon polymers and copolymers, polycarbonates, polyphenyleneoxides, polyesters and copolyesters, acrylic and methacrylic polymers and copolymers, copolymers of butadiene and styrene, copolymers of butadiene and acrylonitrile, copolymers of butadiene and acrylates or methacrylates, copolymers of styrene and acrylates or methacrylates and compatible mixtures thereof. As used herein, the term "copolymer" includes not only bipolymers but terpolymers and other multipolymers.

The polymeric adhesive materials are formed, either filled or unfilled, in a filamentary form such that with a single cut they can be formed into a pad of appropriate size to adhere the IC chip. Thus, the adhesive can be in the form of a thin ribbon which is approximately as wide as the part to be adhered and which then can be cut to length in a single cutting action to form a "pad" which approximates the other dimension of the IC chip to be bonded. Similarly, the adhesive can be formed as a monofilament having about the same cross-section as the lateral edges of the chip to be bonded. The filament can then be sliced to appropriate thickness and used in the process.

In most instances, the adhesive pad is approximately the same size as the chip to be bonded, or perhaps slightly larger. However, it is obvious that the relative size of the pad is not narrowly critical so long as there is sufficient adhesive to present strong bonding. Thus, the surface area of the adhesive pad should be at least about 80% and preferably about 90% or more of the surface area of the piece being bonded.

The thickness of the adhesive must, of course, be sufficient to provide enough adhesive strength for effective bonding. However, if the adhesive exceeds about 125 micrometers in thickness, it is too slow to bond and if it is less than 25 micrometers in thickness, the adhesive is difficult to handle and placement is particularly difficult. Thus a ribbon thickness of 25-50 micrometers is preferred which provides a quite adequate amount of adhesive to form a strong bond between the IC chip and the substrate. In any event, the thickness of the cut adhesive pad should be on the order of 25-125 micrometers, 25-50 micrometers being preferred.

The adhesive relocated by the tools of the invention can be formed into its appropriate approximate shape by the usual prior art method such as solvent casting and by melt extrusion. A suitable method for tape casting is illustrated in U.S. Pat. Nos. 4,536,535 and 4,613,648 to Usala. Upon completion of casting, sheets of the material are then slit to appropriate width and the resultant ribbons are wound on spools for use.

In operation, the die attach pickup tool 20 is positioned on a pad 5 of die attach at a ribbon feeding and cutting station for illustrative purposes to the left of arrow A in FIG. 2. The vacuum source is turned on drawing the pad 5 to the face 23. The tool 20 is lifted raising the pad 5. The tool 20 is moved in the direction of arrow A to just above the bond site 6 of the substrate 7. The substrate 7 illustrated in FIG. 2 is a metal lead frame substrate. However, IC chips are bonded to virtually any kind of surface, including organic substrates as well as ceramic. Thus, the tools of the present invention can be used to bond IC chips to virtually any substrate. The tool 20 is lowered in the direction of arrow B placing the pad 5 upon the bond site 6 which is heated. The tool 20 applies a slight pressure to the pad 5 to secure placement of the pad 5 amd to effect transfer of heat from the site 6 by which the adhesive is softened, but not so that any appreciable adhesive flow will take place. The vacuum is turned off and the tool 20 is returned to the cutting station. After the tool 20 is out of the way, an IC chip 8 can be placed by mechanical means as illustrated by arrow C atop the adhesive pad 5 and laminated thereto.

Figure 3A:
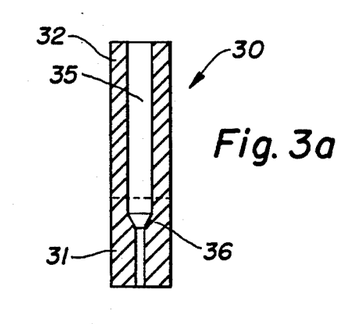
FIGS. 3a, 4a, 5a, 6a, 7a and 8a show cross-sectional front views of pickup tools of the present invention, each embodiment having one hole in its face for contacting a die attach.
Figure 3B:
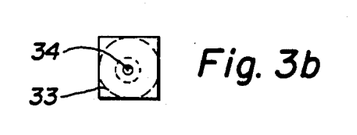
FIGS. 3b, 4b, 5b, 6b, 7b and 8b show end views of pickup tools corresponding to the embodiments depicted in FIGS. 3a through 8a, respectively.

Referring to FIGS. 3a and 3b, front and bottom views, respectively, of an elongated shaped pickup tool 30 of the present invention are illustrated. The tool 30 comprises a head portion 31 which is 1.59 mm square by 2.54 mm long and an end portion 32 which is 1.59 mm in diameter by 3.810 mm long connected to the head portion 31. The head portion 31 has a square face 33 with a hole 34 centrally located on the face 33. A passage 35 having a greater cross-sectional area than the hole 34 is connected to the hole 34 through a tapered passage section 36. The passage 35 passes through some of the head portion 31 and the end portion 32 for connection to a vacuum source. The hole 34 is about four times as long as its diameter. The tool 30 has a longitudinal axis which goes through the center of the hole 34, the passage section 36 and the passage 35. The tapered passage section 36 tapers 30° from this longitudinal axis. In this tool 30, the diameter of the hole 34 is 0.254 mm, the face 33 is 1.59 mm square, and the diameter of the passage 35 is 0.787 mm. These measurements, like subsequently mentioned dimensions, have a tolerance of plus or minus 25.4 micrometers.

Figure 4A:
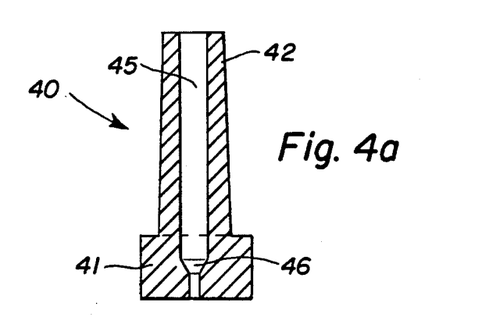
Figure 4B:
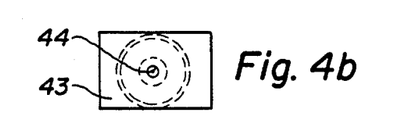

Referring to FIGS. 4a and 4b, front and bottom views, respectively, of another pickup tool 40 of the present invention are shown. Tool 40 comprises a box shaped head portion 41 connected to a tapering cylindrical end portion 42. The head portion 41 has a face 43 with a centrally located hole 44. Further, tool 40 has a passage 45 joined to hole 44 through a tapered passage section 46 and passing through the head and end portions 41 and 42, respectively. Similarly, tool 40 has a longitudinal axis which goes through the center of hole 44, passage section 46 and passage 45. Further, the tapered passage section 46 tapers 30° from this axis. The diameters of hole 44 and passage 45 are the same as that for hole 34 and passage 35, respectively. However, face 43 is 3.43 mm by 3.81 mm, i.e., rectangular, and not square like face 33. The widest diameter of the tapering cylindrical end portion 41 is 3.43 mm and centered on the head portion 41. The narrowest outer diameter of the end portion 42 is 2.92 mm and is for connection to a vacuum source.

Figure 5A:
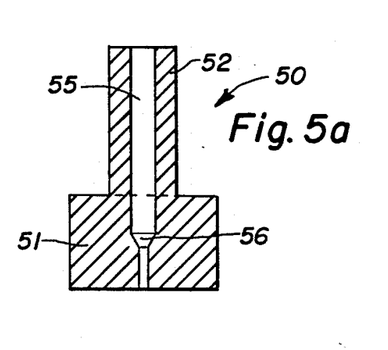
Figure 5B:
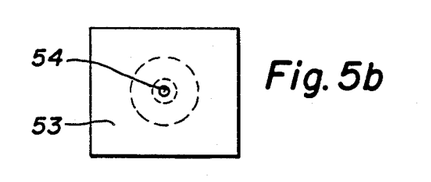

Referring to FIGS. 5a and 5b, there is illustrated another tool 50 of the present invention. Tool 50 has a box shaped head portion 51 which is 3.81 mm by 3.43 mm by 2.54 mm connected to a cylindrical end portion 52 which is 3.81 mm long and 1.58 mm in diameter. The head portion 51 has a rectangular face 53 which is 3.81 mm by 3.43 mm with a hole 54 which is 0.254 mm in diameter and 1.02 mm long. The hole 54 extends to an outwardly tapered passage section 56 which joins to a passage 55 which extends through some of the head portion 51 and the end portion 52 for connection to a vacuum source. The hole 54 has a diameter of 0.254 mm. The passage 55 has a diameter of 0.787 mm. The outwardly tapered passage section 36 tapers 30° from a centerline of the hole 54 and passage 55.

Figure 6A:
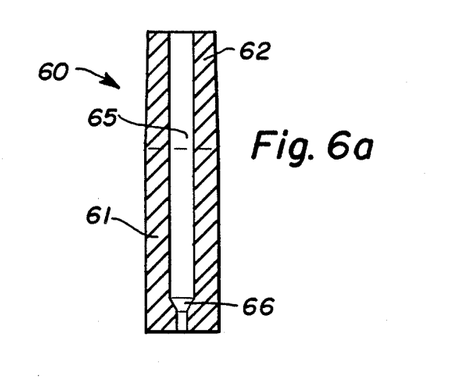
Figure 6B:
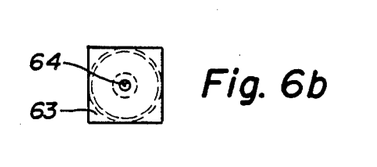

Referring to FIGS. 6a and 6b, there is illustrated another tool 60 of the present invention. The tool 60 has a box shaped head portion 61 which is 3.18 mm square by 7.85 mm long connected to a tapering cylindrical end portion 62 having outer diameters of 3.18 mm at an end connected to the head portion 61 and 2.92 mm at an end for connection to a vacuum source. The head portion 61 has a face 63 which is 3.18 mm square with a centrally located hole 64 which is 0.254 mm in diameter. The hole 64 extends 1.02 mm into the face 63 to an outwardly tapering passage section 66 which tapers 30° from a straight longitudinal axis through the hole 64 and passage section 66. The passage section 66 connects to a 0.787 mm diameter passage 65 which extends through the remainder of the head portion 61 and the end portion 62 for connection to a vacuum source.

Figure 7A:
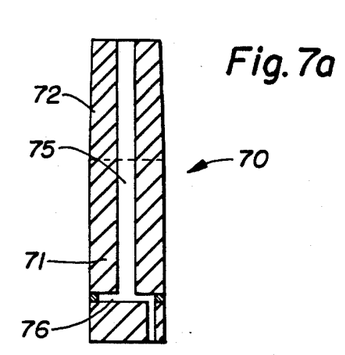
Figure 7B:
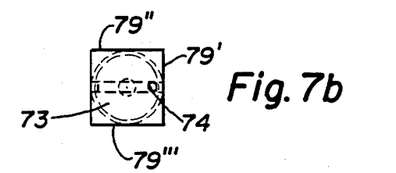

Referring to FIGS. 7a and 7b, another embodiment or tool 70 is illustrated which is just like the embodiment illustrated in FIGS. 6a and 6b, except (1) the hole 74 is not centered on the face 73 and (2) the intermediate passage section 76 is different. More specifically, the centerline of the hole 74 is located 0.635 mm from a first edge 79' of the face 73 and mid-way between edges 79'' and 79''' of the face 73 perpendicular to the first edge 79'. The hole 74 extends 1.02 mm into the face 73 and intersects a perpendicular cylindrical passage section 76 which is 0.508 mm in diameter and is drilled entirely through the head portion 71 also intersecting passage 75. Both ends of the passage section 76 are plugged or sealed with suitable means, such as by brazing or soldering.

Figure 8A:
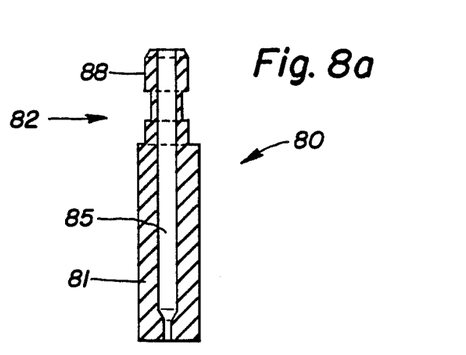
Figures 8B, 10A:
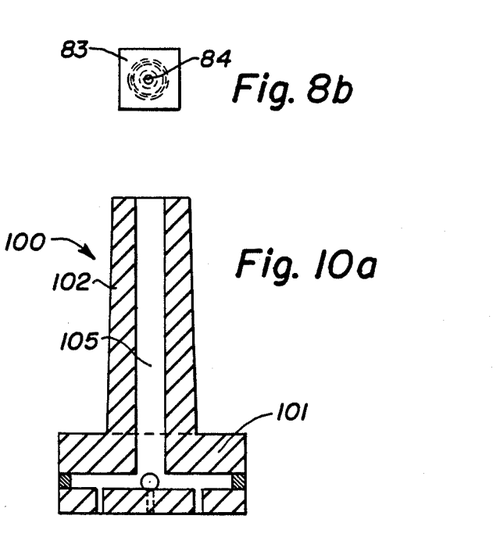
FIGS. 9a, 10a, 11a and 12a depict cross-sectional front views of pickup tools of the present invention, each embodiment having a plurality of holes in its face for contacting a die attach.

FIGS. 8a and 8b show a pickup tool 80 similar to that shown in FIGS. 3a and 3b. However, tool 80 has an end portion 82 which includes a conventional nipple 88 for connecting to a vacuum source.

FIGS. 9a through 14 show embodiments having a plurality of holes.

Figure 9A:
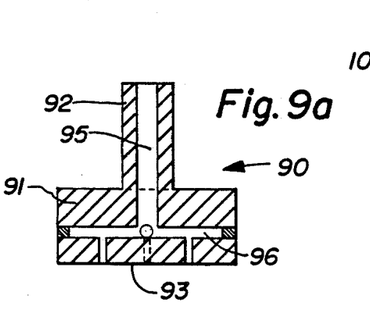
Figure 9B:
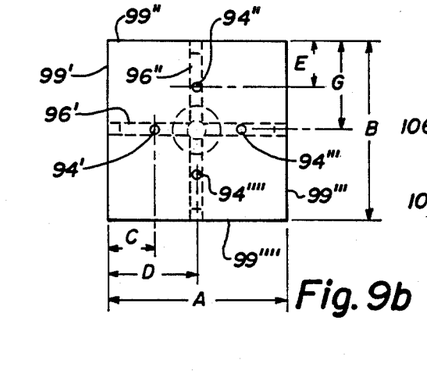
FIGS. 9b, 10b, 11b and 12b show end views of the pickup tools illustrated in FIGS. 9a through 12a, respectively.

FIGS. 9a and 9b show a pickup tool 90 having a box shaped head portion 91 which is A millimeters by B millimeters by 2.54 mm. A cylindrical end portion 92 with a diameter of 1.59 mm is connected at one end to the head portion 91. The head portion 91 has a rectangular or square face 93 which is A mm by B mm. The face 93 has first 99', second 99", third 99''' and fourth 99'''' edges. The first 99' and third 99''' edges are parallel to each other and perpendicular to the second 99" and fourth 99'''' edges. Four holes 94 are drilled 1.02 mm into the face 93. A first one 94' of the holes is located, i.e., centered, C mm from the first face edge 99' and G mm from the second face edge 99". A second one 94" of the holes is located, i.e., centered, E mm from the second edge 99" and D mm from the first edge 99'. A third hole 94''' is centered C mm from the third edge 99''' and G mm from the second edge 99". A fourth hole 94'''' is centered E mm from the fourth edge 99'''' and D mm from the first edge 99'. Values for A, B, C, D and E are provided in Table I. Holes 94' and 94''' intersect with a cylindrical passage section 96' which is 0.610 mm in diameter with its longitudinal axis G mm from the second edge 99". Holes 94" and 94'''' intersect another cylindrical passage section 96" which is 0.610 mm in diameter with its longitudinal axis D mm from edge 99'. Passage 95 connects with the center of passage sections 96' and 96". Passage 95 goes through part of the head portion 91 and the center of end portion 92. Passage 95 has a diameter of 0.787 mm. The ends of passage sections 96' and 96" are plugged like the FIG. 7 embodiment.

TABLE I

| TOOL | MILLIMETERS (mm) | | | | | |
|------|---|---|---|---|---|---|
|      | A | B | C | D | E | G |
| 9.1  | 6.35 | 6.35 | 1.59 | 3.18 | 1.59 | 3.18 |
| 9.2  | 6.35 | 5.97 | 1.59 | 3.18 | 1.49 | 2.98 |
| 9.3  | 5.92 | 5.79 | 1.48 | 2.96 | 1.45 | 2.90 |
| 9.4  | 11.4 | 5.59 | 2.84 | 5.69 | 1.40 | 2.79 |
| 9.5  | 7.57 | 3.38 | 1.89 | 3.78 | 0.845 | 1.69 |
| 9.6  | 7.62 | 4.27 | 1.91 | 3.81 | 1.07 | 2.13 |
| 9.7  | 5.28 | 5.28 | 1.32 | 2.64 | 1.32 | 2.64 |
| 9.8  | 5.23 | 6.88 | 1.31 | 2.62 | 1.72 | 3.44 |

Figure 10B:
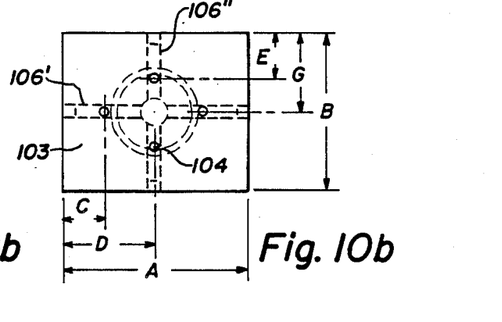

Referring to FIGS. 10a and 10b, there is shown another tool 100 similar in shape to tool 40. Tool 100 has a box shaped head portion 101 which is A mm by B mm by 3.00 mm. A tapering cylindrical end portion 102 having two ends with diameters of 3.43 mm and 2.92 mm, respectively, is connected at its larger end to a surface of head portion 101. The head portion has a face 103 with four holes 104 located, as described in reference to FIGS. 9a and 9b, with A=7.32 mm, B=6.05 mm, C=1.83 mm, D=A/2 mm, E=1.52 mm, and G=B/2 mm. Like the FIG. 9 embodiment, tool 100 has passage sections 106' and 106" interconnecting the holes 104 and a passage 105 extending centrally through some of the head portion 101 and the end portion 102. Here the passage 105 is 0.787 mm in diameter and the passage sections 106' and 106" are 0.610 mm in diameter.

Figure 11A:
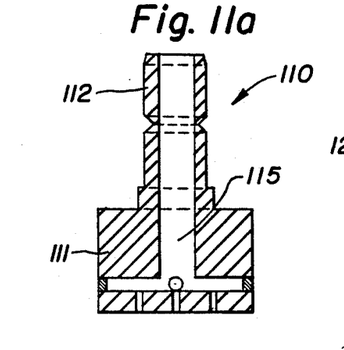
Figure 11B:
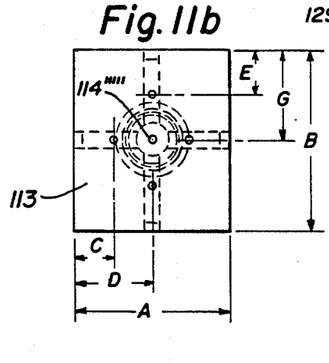

FIGS. 11a and 11b show a pickup tool 110 having a head portion 111 which is A by B by 4.06 mm. An end portion 112 connects to the head portion 111. The end portion 112 is shaped like another conventional fitting. The head portion 111 has a face 113 sized A by B with four holes 114 positioned, as described in reference to FIGS. 9a and 9b, with A=6.35 mm, B=7.11 mm. C=1.58 mm, D=A/2 mm, E=1.78 mm, and G=B/A mm. A fifth hole 114''''' is centered on face 113. In this embodiment, the hole diameters are 0.254 mm, the passage sections' diameters are 0.610 mm, but the passage diameter is 1.59 mm.

Figure 12A:
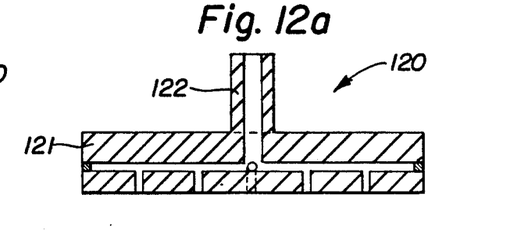
Figure 12B:
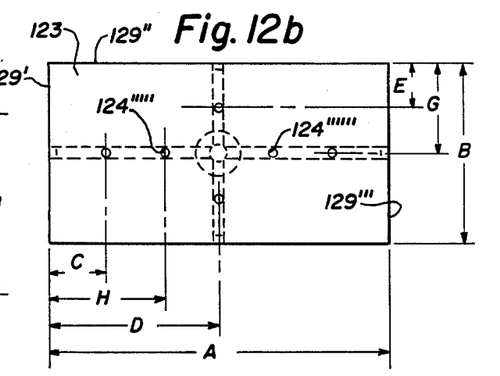

FIGS. 12a and 12b show a tool 120 similar to the tools described in reference to FIGS. 9a and 9b with A=16.3 mm, B=7.98 mm, C=2.72 mm, D=A/2 mm, E=1.98 mm and G=B/2 mm. However, tool 120 has two more holes 124''''' and 124''''''. Hole 124''''' is centered H or 5.41 mm from the face first edge 129' and G from the face second edge 129". Hole 124'''''' is centered H or 5.41 mm from the face third edge 129''' and G from the face second edge 129". Thus, the tool 120 has six holes.

Figures 13, 14:
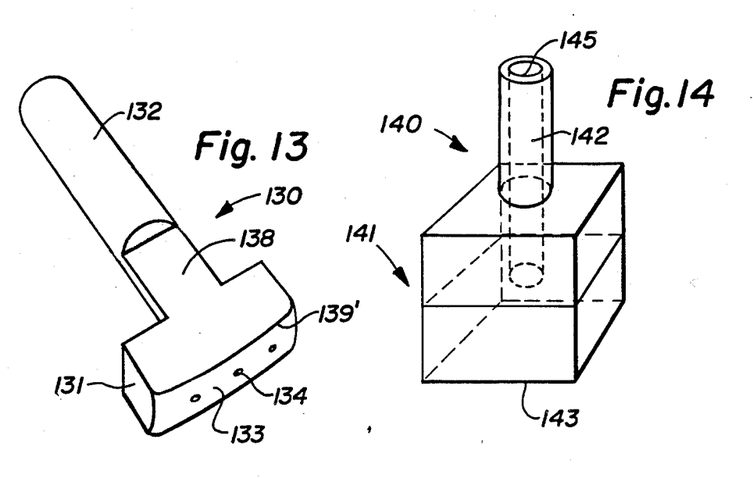
FIG. 13 is a perspective view of another pickup tool of the present invention having a convex face for contacting a die attach and a flat surface on its head portion and end portion for positioning adjacent a ribbon cutting device.
FIG. 14 is a perspective view of another pickup tool embodiment of the present invention having a porous substance as its face for contacting a die attach.

FIG. 13 illustrates another pickup tool 130 of the present invention. The tool 130 has a head portion 131 having a slightly convex face 133 with three holes 134 therein. An end portion 132 is connected to the head portion 131. A passage section (not depicted) connects the holes to a passage (not depicted) which passes through some of the head portion 131 and the end portion 132 for connection to a vacuum source. The head portion 131 and the end portion 132 have a joint flat surface 138 which intersects at an edge 139' with the face 133. The surface 138 enables the tool to be positioned at the very edge of the cutting station, thus, enabling square pickup of the die attach. The surface 138 need not extend beyond the head portion 131 onto the end portion 132. The surface only needs to be as high as necessary to avoid obstructions, typically, at the cutting stations. Other embodiments disclosed herein have flat surfaces which similarly facilitate positioning of their tools.

Referring to FIG. 14, there is illustrated a pickup tool 140 having a head portion 141 connected to a cylindrical end portion 142. The head portion 141 has a flat face 143 made of a porous means or material. A passage 145 extends through the end portion 142 and part of the head portion 141 to the porous means or material. The porous means or material is secured to the remainder of the head portion 141 by any suitable means, such as by brazing or soldering, or use of other high temperature adhesives. The head portion 141 has four sides intersecting the face 143. Areas of these four sides adjacent the face 143 are also made of the porous material. These porous areas are preferably sealed to prevent air passage through them by any suitable means, such as by coating them with a high temperature adhesive or by securing non-porous plates on the areas. It is to be understood that the porous means can be a perforated plate, a screen or a photo etched plate made, such as, by chemical etching.

The tools of the present invention can be made of brass, stainless steel, nickel or chrome plated base metal, ceramic material, high temperature resistant plastic, or the like. Further, all or part of the tools of the present invention, including the head portion, can be provided with a plastic coating as long as the holes remain free of the plastic. Any suitable plastic can be used for the coatings including PFA fluorocarbon or polyimide films.

Those skilled in the art, having the benefit of the teachings of the present invention as hereinabove set forth, can effect numerous modifications thereto. These modifications are to be construed as being encompassed within the scope of the present invention as set forth in the appended claims.

I claim:

1. A die attach pickup tool for picking up a flexible ribbon shaped die attach having a thickness in a range of about 25 to 125 micrometers, an elastic modulus in the range of about 500 to 7,500 N/mm$^2$ at 23° C. and a first surface area from a first station, transferring the die attach to a heated bond site and depositing the die attach on the bond site, the tool comprising:

a face for contacting the die attach, the face having a second surface area of at least about 1.27 mm square and a hole; and passage means connected to the hole for providing a vacuum through the hole, such that when each point of the first surface area is in contact with a point of the second surface area or adjacent the hole then, upon turning on the vacuum source, the tool is adapted to pickup and transfer the die attach and, upon turning the vacuum source off, the tool is adapted to deposit the die attach, the picking up, transferring and depositing all occurring while said die attach is in a substantially flat position.

2. The tool as in claim 1, wherein:
the hole has a circular cross-section with a diameter in the range of about 0.254 to 0.900 mm.

3. The tool as in claim 2, further comprising:
the face having another hole for each about 2.54 mm square that the second area is greater than 2.54 mm square, each said another hole connected to the passage means.

4. The tool as in claim 3, wherein:
the face has a plurality of holes, each said hole having a circular cross-section with a diameter in the range of about 0.254 to 0.900 mm.

5. The tool as in claim 4, wherein:
the holes are spaced from one another and from edges of the face.

6. The tool as in claim 2, wherein:
the face is flat.

7. The tool as in claim 2, wherein:
the face is convex.

8. The tool as in claim 2, wherein:
the face comprises a porous material.

9. The tool as in claim 2, wherein:
the face having an edge to facilitate positioning of the tool when picking up the die attach.

10. The tool as in claim 2, wherein:
the passage means has a cross-sectional area that is greater than the cross-section of the hole.

* * * * *